(12) United States Patent
Matsumoto et al.

(10) Patent No.: US 8,800,484 B2
(45) Date of Patent: Aug. 12, 2014

(54) PLASMA PROCESSING APPARATUS

(75) Inventors: Naoki Matsumoto, Sendai (JP); Kazuyuki Kato, Sendai (JP); Masafumi Shikata, Ikeda (JP); Kazuto Takai, Sendai (JP)

(73) Assignee: Tokyo Electron Limited (JP)

( * ) Notice: Subject to any disclaimer, the term of this patent is extended or adjusted under 35 U.S.C. 154(b) by 720 days.

(21) Appl. No.: 13/003,102

(22) PCT Filed: Jun. 16, 2009

(86) PCT No.: PCT/JP2009/060916
§ 371 (c)(1),
(2), (4) Date: Jan. 20, 2011

(87) PCT Pub. No.: WO2010/004836
PCT Pub. Date: Jan. 14, 2010

(65) Prior Publication Data
US 2011/0114261 A1    May 19, 2011

(30) Foreign Application Priority Data

Jul. 9, 2008 (JP) ................................ 2008-178863
Jul. 9, 2008 (JP) ................................ 2008-178864

(51) Int. Cl.
| | | |
|---|---|---|
| *C23C 16/511* | (2006.01) | |
| *H01L 21/67* | (2006.01) | |
| *H01J 37/32* | (2006.01) | |
| *H01L 21/687* | (2006.01) | |
| *C23F 1/00* | (2006.01) | |

(52) U.S. Cl.
CPC ...... *H01L 21/6719* (2013.01); *H01L 21/67126* (2013.01); *H01J 37/32449* (2013.01); *H01J 37/3244* (2013.01); *H01L 21/68785* (2013.01); *H01J 37/32192* (2013.01); *H01J 37/32238* (2013.01)

USPC ........ 118/723 MW; 156/345.41; 156/345.33; 118/723 AN; 118/723 ME

(58) Field of Classification Search
USPC .............................. 118/723 MW; 156/345.41
See application file for complete search history.

(56) References Cited

U.S. PATENT DOCUMENTS 4,270,999 A * 6/1981 Hassan et al. ............ 204/192.32
5,372,674 A * 12/1994 Steinberg ........................ 216/17
(Continued)

FOREIGN PATENT DOCUMENTS

JP    2005-100931    4/2005
JP    2007-149559    6/2007
(Continued)

OTHER PUBLICATIONS

Korea Office Action—Korean Application No. 10-2010-7028917 issued on Dec. 20, 2011, citing JP 2007-149559.

(Continued)

*Primary Examiner* — Gordon R Baldwin
*Assistant Examiner* — Charlee Bennett
(74) *Attorney, Agent, or Firm* — Cantor Colburn LLP

(57) ABSTRACT

A plasma processing apparatus includes a processing container in which a plasma processing is performed on a substrate to be processed, a holding stage which is disposed in the processing container and holds thereon the substrate to be processed, a dielectric plate which is provided at a location facing the holding stage and transmits a microwave into the processing container, and a reactive gas supply unit which supplies a reactive gas for plasma processing toward the central region of the substrate to be processed held by the holding stage. Here, the reactive gas supply unit includes an injector base, which is disposed at a location more recessed inside the dielectric plate than a wall surface of the dielectric plate facing the holding stage. A supply hole, which supplies a reactive gas for plasma processing into the processing container, is formed in the injector base.

12 Claims, 16 Drawing Sheets

(56) References Cited

U.S. PATENT DOCUMENTS

| | | | |
|---|---|---|---|
| 5,643,394 A * | 7/1997 | Maydan et al. | 156/345.33 |
| 5,734,143 A * | 3/1998 | Kawase et al. | 219/121.43 |
| 5,996,528 A * | 12/1999 | Berrian et al. | 118/723 E |
| 6,433,298 B1 * | 8/2002 | Ishii | 219/121.43 |
| 6,528,752 B1 * | 3/2003 | Ishii et al. | 219/121.43 |
| 2006/0219361 A1 * | 10/2006 | Wang et al. | 156/345.33 |
| 2007/0145021 A1 * | 6/2007 | Wang et al. | 219/121.43 |
| 2007/0187363 A1 | 8/2007 | Oka et al. | |
| 2007/0256785 A1 * | 11/2007 | Pamarthy et al. | 156/345.33 |
| 2008/0282979 A1 * | 11/2008 | Chen et al. | 118/722 |
| 2009/0242130 A1 * | 10/2009 | Tian et al. | 156/345.41 |
| 2012/0267048 A1 * | 10/2012 | Moyama et al. | 156/345.33 |
| 2013/0029494 A1 * | 1/2013 | Sasaki et al. | 438/724 |

FOREIGN PATENT DOCUMENTS

| | | | |
|---|---|---|---|
| JP | 2007149559 A * | 6/2007 | |
| JP | 2007-243138 | 9/2007 | |

OTHER PUBLICATIONS

International Search Report—PCT/JP2009/060916 dated Sep. 29, 2009.

* cited by examiner

PLASMA PROCESSING APPARATUS

TECHNICAL FIELD

The present invention relates to a plasma processing apparatus, and more particularly, to a plasma processing apparatus which generates plasma by using a microwave as a plasma source.

BACKGROUND ART

Semiconductor devices, such as LSI (large scale integrated circuit), are manufactured by performing a plurality of processes, such as etching or CVD (chemical vapor deposition), sputtering, and the like, with respect to a silicon substrate (wafer) as a substrate to be processed. Examples of these processes, such as etching or CVD, sputtering, and the like, may include a process using plasma as an energy supply source, is that is, plasma etching or plasma CVD, plasma sputtering, and the like.

Here, a plasma processing apparatus employing a microwave as a plasma generation source is disclosed in Japanese Patent Laid-Open Publication No. 2005-100931 (Patent Document 1). According to the Patent Document 1, a tapered protrusion or recess portion is formed on the bottom surface of a top plate (dielectric plate) provided in the plasma processing apparatus. An optimal resonance region of electric field is formed at the tapered protrusion or recess portion of the bottom surface of the top plate by means of a microwave generated by a microwave generator, and thus stable plasma is generated in a chamber (processing container), whereby the aforementioned etching process or the like is performed.

(Patent Document 1) Japanese Patent Laid-Open Publication No. 2005-100931

DISCLOSURE OF THE INVENTION

Technical Problem

When a plasma processing is performed on a substrate to be processed, a center gas introduction mechanism for supplying a reactive gas toward the center portion of the substrate to be processed may be employed for efficiency or the like of the plasma processing.

FIG. 16 is a cross sectional view briefly showing a plasma processing apparatus 201 employing the center gas introduction mechanism. Furthermore, in drawings described below, the upward direction of the paper surface will be considered as vertically upward direction in the drawings. As shown in FIG. 16, the plasma processing apparatus 201 includes a disk-like dielectric plate 206, an injector 203, which is provided at the central region in the diametric direction of the dielectric plate 206 and serves as a reactive gas supply unit which supplies a reactive gas for a plasma processing into a processing container 202, and a holding stage 204, which is provided at a location facing the dielectric plate 206 and holds a substrate to be processed 205.

The injector 203 includes a protrusion 207, which extends toward the holding stage 204. A supply hole 209, which supplies the reactive gas into the processing container 202, is formed in a front end portion 208 of the protrusion 207. The front end portion 208 of the protrusion 207, in which the supply hole 209 is formed, is located so that a distance between the holding stage 204 and the front end portion 208 is shorter is than a distance between the holding stage 204 and the a bottom surface 210 of the dielectric plate 206, which is the surface facing the holding stage 204. By using the injector 203 having the above-stated configuration, a reactive gas is supplied into the processing container 202 and a plasma processing is performed.

During the plasma processing, an electric field is generated at a location between the holding stage 204 and the dielectric plate 206, that is, a location below the bottom surface 210 of the dielectric plate 206. Here, if the front end portion 208 of the protrusion 207 in which the supply hole 209 is formed is located at a location below the bottom surface 210 of the dielectric plate 206, the front end potion 208 may be exposed to a region in which an electric field is generated, and thus the electric field may concentrates on the front end portion 208. In this case, excessive load is applied to the front end portion 208 due to the concentration of the electric field. For example, in case of using a mixed gas containing Ar as a reactive gas, the temperature of the front end portion 208 may rise up to 200° C. In this case, the lifespan of not only the injector 203, but also the lifespan of the plasma processing apparatus 201 may be shortened.

The present invention is to provide a plasma processing apparatus with a long lifespan.

Technical Solution

A plasma processing apparatus according to an embodiment of the present invention includes a processing container in which a plasma processing is performed on a substrate to be processed; a holding stage which is disposed in the processing container and holds thereon the substrate to be processed; a microwave generator which generates a microwave for exciting plasma; a dielectric plate which is provided at a location facing the holding stage and transmits a microwave into the processing container; and a reactive gas supply unit which supplies a reactive gas for plasma processing toward the central region of the substrate to be processed held by the holding stage. The reactive gas supply unit includes an injector base, which is disposed at a location more recessed inside the dielectric plate than a wall surface of the dielectric plate facing the holding stage. A supply hole, which supplies a reactive gas for plasma processing into the processing container, is formed in the injector base.

During the plasma processing, an electric field due to a microwave plasma is is generated in a space between the holding stage and the dielectric plate. In the plasma processing apparatus as described above, since the injector base included in the reactive gas supply unit is disposed at a location more recessed inside the dielectric plate than the wall surface of the dielectric plate, the injector base is not exposed to a region in which an electric field is generated. Therefore, a possibility that an electric field concentrates on the injector base in which the supply hole for supplying a reactive gas into the processing container is formed may be reduced, and thus a load with respect to the injector base due to an electric field may be reduced. Therefore, a plasma processing apparatus as described above may have a long lifespan.

The supply hole may be formed in the wall surface of the injector base facing the holding stage.

Preferably, the wall surface facing the holding stage may be flat.

Furthermore, the injector base may be configured to include a protrusion, which extends from the wall surface of the injector base facing the holding stage toward the holding stage and whose length is within a range of not reaching the wall surface of the dielectric plate facing the holding stage.

The supply hole may be formed in the front end portion of the protrusion.

Preferably, the dielectric plate may have a disk-like shape, and the supply hole may be formed in the injector base to be located at the central region in the diametric direction of the dielectric plate.

Furthermore, a base housing portion, which penetrates the dielectric plate in the plate thickness direction and houses the injector base, may be provided in the dielectric plate, a seal, which is closely adhered to a wall surface of the base housing portion and tightly seals the interior of the processing container, may be provided on a wall surface of the injector base facing the wall surface of the base housing portion, and a step may be formed between a wall surface, of the injector base, exposed to the inside of the processing container and the wall surface, of the injector base, on which the seal is provided.

When a plasma processing is performed on a substrate to be processed, a center gas introduction mechanism for supplying a reactive gas toward the central region of the substrate to be processed may be employed for efficiency of the plasma processing.

Here, the configuration of a plasma processing apparatus employing the center is gas introduction mechanism will be briefly described. In a plasma processing apparatus employing the center gas introduction mechanism, a reactive gas supply unit, which supplies a reactive gas for plasma processing, includes an injector base in which a supply hole, which supplies a reactive gas for plasma processing into the processing container, is formed. The injector base is housed in a base housing portion, which is provided in the dielectric plate so as to penetrate the dielectric plate in the plate thickness direction at the central region in the diametric direction of the dielectric plate. Furthermore, an O-ring which is a rubber seal is provided on a wall surface of the injector base facing the wall surface of the base housing portion. The O-ring is tightly adhered to a wall surface of the base housing unit and tightly seals the processing container. In other words, the air-tightness of the processing container is secured by interposing the O-ring between the wall surface of the injector base and the wall surface of the base housing portion.

In the plasma processing, plasma is generated in the processing container, and a reactive gas is supplied into the processing container via the supply hole formed in the wall surface of the injector base. Here, a reactive gas containing oxygen may be used as the reactive gas. In this case, an oxygen radical is generated by plasma generated in the processing container. Since such a radical has aggressiveness with respect to a seal, such as an O-ring, an O-ring is attacked by a radical and is deteriorated or worn off. The phenomenon becomes more noticeable if an O-ring is exposed to a region with a high radical concentration. As a result, the lifespan of the O-ring is reduced, and thus a long lifespan of a plasma processing apparatus may not be secured.

However, according to the configuration of the present invention as stated above, the plasma processing apparatus of the present invention may have a long lifespan. In other words, during the plasma processing, a radical of a reactive gas is generated in the sealed space of a processing container and attacks a seal interposed between a wall surface of an injector base and a base housing portion. However, in a plasma processing apparatus employing the configuration as stated above according to the present invention, a step is formed between a wall surface of an injector base, which is the wall surface exposed to the inside of a processing container, and a wall surface on which a seal is provided, and thus a sufficient distance may be secured between the wall surface exposed to the inside of the processing container and the wall surface on which is the seal is provided. As a result, the seal may be provided in a region with a relatively low radical concentration, and thus aggressiveness of a radical with respect to the seal may be reduced. Therefore, reduction of the lifespan of the seal may be prevented, and thus the plasma processing apparatus may have a long lifespan.

Preferably, a distance between the bottom surface of a dielectric plate and the wall surface, of an injector base, exposed to the inside of the processing container is different from a distance between the bottom surface of the dielectric plate and the wall surface, of the injector base, on which the seal is provided.

Preferably, a wall surface of the injector base forming the step may include a surface extending perpendicularly to at least one of the wall surface, of the injector base, exposed to the inside of the processing container and the wall surface, of the injector base, on which the seal is provided.

Preferably, a recess portion, which is recessed from the wall surface of the injector base so as to house the seal, is formed in the wall surface of the injector base, on which the seal is provided.

Preferably, a plurality of the steps may be formed.

Preferably, the seal may include an O-ring.

Preferably, the reactive gas may include a reactive gas containing oxygen.

Advantageous Effects

In a plasma processing apparatus as described above, since the injector base included in the reactive gas supply unit is disposed at a location more recessed inside the dielectric plate than the wall surface of the dielectric plate, the injector base is not exposed to a region in which an electric field is generated, during plasma processing. Therefore, concentration of an electric field on the injector base in which the supply hole for supplying a reactive gas into the processing container is formed does not occur, and thus a load with respect to the injector base due to an electric field may be reduced. Therefore, a plasma processing apparatus as described above may have a long lifespan.

Figure 1:
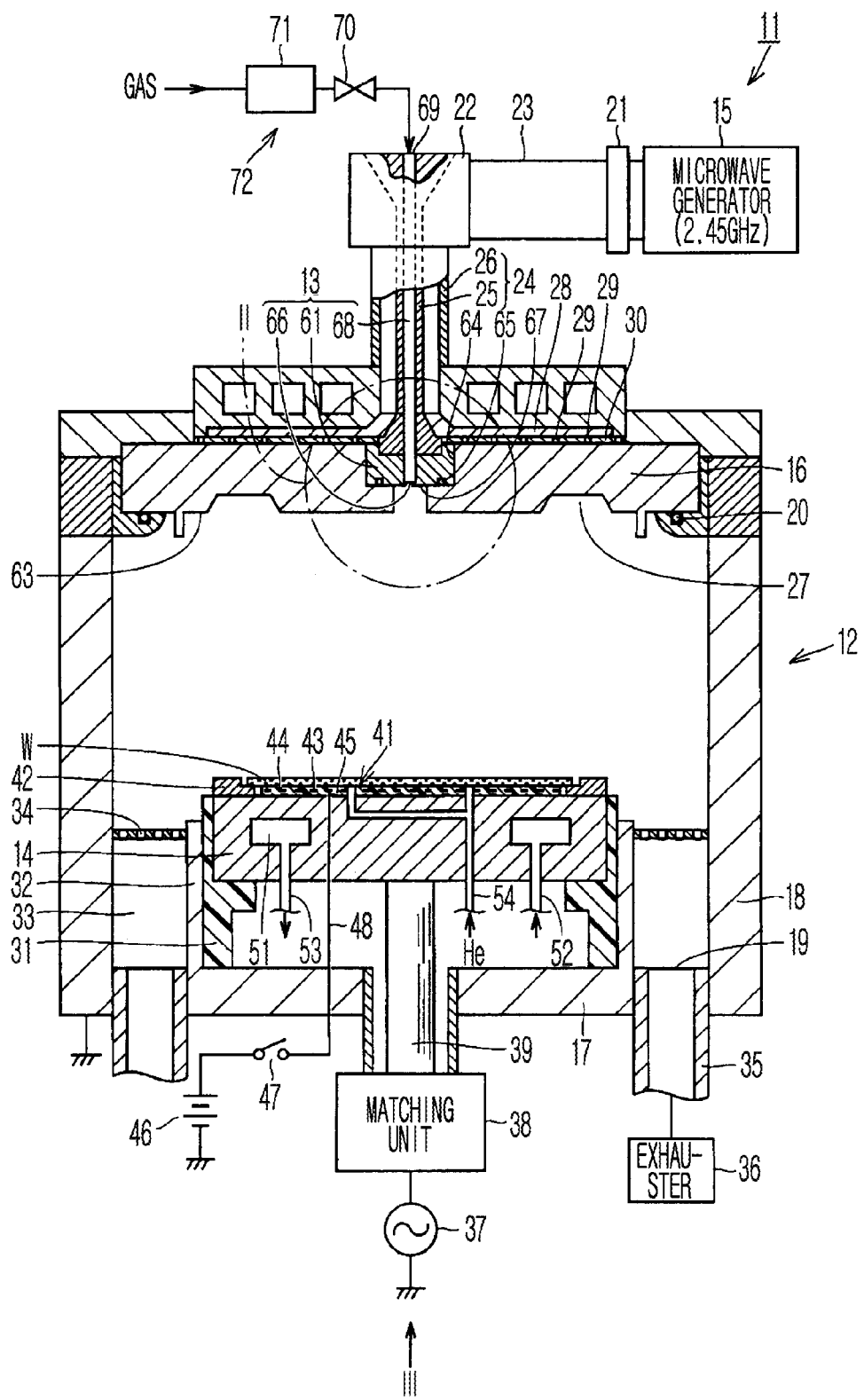
FIG. 1 is a schematic cross sectional view showing the major portion of a plasma is processing apparatus according to an embodiment of the present invention.

EXPLANATION ON REFERENCE NUMERALS 11, 87, 111, 116, 121, 131, 141: plasma processing apparatus
12: processing container
13: reactive gas supply unit
14: holding stage
15: microwave generator
16, 90, 122, 146: dielectric plate
17: bottom portion
18: sidewall
19: exhaust hole
20, 65, 95, 114, 119, 126, 134, 148: O-ring
21: matching
22: mode converter
23: waveguide
24: coaxial waveguide
25: center conductor
26: outer conductor
27, 106: recess portion
28: wavelength-shortening plate
29: slot hole
30: slot antenna
31, 32: cylindrical holding unit
33: exhaust passage
34: baffle plate
35: exhaust pipe
36: exhauster
37: high frequency power supply
38: matching unit
39: power feeding rod
41: electrostatic chuck
42: focus ring
43: electrode
44, 45: insulation film
46: direct current power supply
47: switch
48: coated wire 51: refrigerant chamber
52, 53: pipe
54: gas supply pipe
61, 81, 91, 147: injector base
63, 93, 123, 150: bottom surface
64, 94: base housing portion
66, 86, 96, 112, 117, 124, 132, 142: supply hole
82, 97, 103, 104, 105, 107, 113, 118, 125, 127, 133, 135, 136, 137, 138, 143, 149: wall surface
68: gas passage
69: gas inlet
70: opening and shutting valve
71: flow controller
72: gas supply system
108: contact portion
109: center portion
100: point
83, 145: protrusion
84: top surface
85, 144: front end portion

BEST MODE FOR CARRYING OUT THE INVENTION

Hereinafter, embodiments of the present invention will be described with reference to attached drawings. FIG. 1 is a schematic cross sectional view showing the major portion of a plasma processing apparatus according to an embodiment of the present invention. As shown in FIG. 1, a plasma processing apparatus 11 includes a processing container 12 in which a plasma processing is performed on a substrate to be processed W, a reactive gas supply unit 13 which supplies a reactive gas for a plasma processing into the processing container 12, a disk-like holding stage 14 which holds thereon the substrate to be processed W, a microwave generator 15 which generates a microwave for exciting plasma, a dielectric plate 16 which is arranged at a location facing the holding stage 14 and transmits the microwave generated by the microwave generator 15 into the processing container 12, and a control unit (not shown) which controls the overall operations of the plasma processing apparatus 11. The control unit controls processing conditions for performing a plasma processing on the substrate to be processed W, such as a flow of gas in the reactive gas supply unit 13, a pressure inside the processing container 12, and the like.

The processing container 12 includes a bottom portion 17, which is located below the holding stage 14, and a sidewall 18, which extends upward from the periphery of the bottom portion 17. The sidewall 18 has a cylindrical shape. An exhaust hole 19 is formed in the bottom portion 17 of the processing container 12. The top of the processing container 12 is opened, and the processing container 12 may be sealed by the dielectric plate 16, which is arranged on top of the processing container 12, and an O-ring 20, which is interposed between the dielectric plate 16 and the processing container 12 as a sealing member.

The microwave generator 15 having a matching 21 is connected to the upper portion of a coaxial waveguide 24, which transmits a microwave, via a mode converter 22 and a waveguide 23. The coaxial waveguide 24 includes a center conductor 25, which is provided at the center in the diametric direction, and an outer conductor 26, which is provided outside of the diametric direction of the center conductor 25 in the diametric direction. The upper end of the center conductor 25 is connected to a ceiling partition wall of the mode converter 22. For, example, 2.45 GHz is selected as a is frequency of a microwave generated by the microwave generator 15.

Furthermore, a waveguide having a circular cross-section or a rectangular cross-section is used as the waveguide 23.

The dielectric plate 16 has a disk-like shape and is formed of a dielectric material. A ring-shaped recess portion 27, which is recessed in a tapered shape for easily generating standing waves from a transmitted microwave, is formed in the bottom portion of the dielectric plate 16. By using the recess portion 27, plasma may be efficiently generated by a microwave below the dielectric plate 16. Furthermore, the dielectric plate 16 may be formed of quarts or alumina, for example.

Furthermore, the plasma processing apparatus 11 includes a wavelength-shortening plate 28, which propagates a microwave transmitted by the coaxial waveguide 24, and a slot antenna 30, which has a thin disk-like shape and transmits a microwave to the dielectric plate 16 via a plurality of slot holes 29. A microwave generated by the microwave generator 15 passes through the coaxial waveguide 24, propagates to the wavelength-shortening plate 28, and is transmitted to the dielectric plate 16 via the plurality of slot holes 29 formed in the slot antenna 30. A microwave transmitted through the dielectric plate 16 generates an electric field just below the dielectric plate 16 and generates plasma in the processing container 12.

The holding stage 14 also functions as a high frequency electrode and is held by a cylindrical insulative holding unit 31, which extends vertically upward from the bottom portion 17. A ring-shaped exhaust passage 33 is formed between a conductive cylindrical holding unit 32, which extends vertically upward from the bottom portion 17 of the processing container 12 along the periphery of the cylindrical holding unit 31, and the sidewall 18 of the processing container 12. A ring-shaped baffle plate 34 in which a plurality of via holes are formed is provided at the upper portion of the exhaust passage 33. An exhauster 36 is connected to the bottom portion of the exhaust hole 19 via an exhaust pipe 35. The exhauster 36 includes a vacuum pump, such as a turbo molecule pump or the like. The inner pressure of the processing container 12 may be depressurized to a desired vacuum level by using the exhauster 36.

A high frequency power supply 37 for a RF bias is electrically connected to the holding stage 14 via a matching unit 38 and a power feeding rod 39. The high frequency power supply 37 outputs a predetermined high frequency suitable for is controlling energy of ions attracted to the substrate to be processed W, e.g., a high frequency of 13.65 MHz, at a predetermined power level. The matching unit 38 houses a matcher for performing a matching between an impedance on the side of the high frequency power supply 37 and impedance on a load side, such as an electrode, plasma, and the processing container 12. A blocking condenser for self-bias generation is included in the matcher.

An electrostatic chuck 41 for holding the substrate to be processed W by using electrostatic absorption force is provided on the top surface of the holding stage 14. Furthermore, a focus ring 42, which circularly surrounds the substrate to be processed W, is provided outside of the diametric direction of the electrostatic chuck 41. The electrostatic chuck 41 is formed by interposing an electrode 43, which is formed of a conductive film, between a pair of insulation films 44 and 45. A high voltage direct current power supply 46 is electrically connected to the electrode 43 via a switch 47 and a coated wire 48. From the Coulomb's force caused by a direct current voltage applied by the direct current power supply 46, the substrate to be processed W may be absorbed and held on the electrostatic chuck 41.

A ring-shaped refrigerant chamber 51, which extends in the circumferential direction of the holding stage 14, is provided inside the holding stage 14. A refrigerant of a predetermined temperature, e.g., cooling water, is circulatorily supplied to the refrigerant chamber 51 by a chiller unit (not shown) via pipes 52 and 53. A temperature for processing the substrate to be processed W held on the electrostatic chuck 41 may be controlled by using a temperature of a refrigerant. Furthermore, a heat transfer gas from a heat transfer gas supply unit (not shown), e.g., He gas, is supplied to a space between the top surface of the electrostatic chuck 41 and the rear surface of the substrate to be processed W via a gas supply pipe 54.

Figure 2:
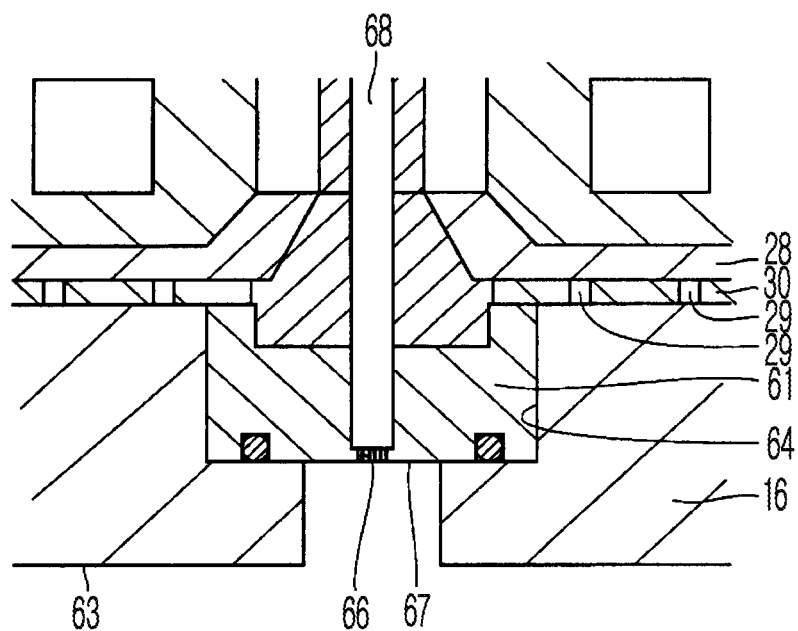
FIG. 2 is a magnified view of a portion indicated by II in the plasma processing apparatus shown in FIG. 1.

Here, detailed description of the configuration of the reactive gas supply unit 13 will be given below. FIG. 2 is a magnified diagram of the portion indicated by II in the plasma processing apparatus 11 shown in FIG. 1. As shown in FIGS. 1 and 2, the reactive gas supply unit 13 includes an injector base 61, which is arranged at a location more recessed inside the dielectric plate 16 than the bottom surface 63 of the dielectric plate 16, which becomes a wall surface facing the holding stage 14. A base housing portion 64, which penetrates the central region of the diametric direction of the dielectric is plate 16 in the plate thickness direction and houses the injector base 61, is provided in the dielectric plate 16. The injector base 61 is provided to be housed in the base housing portion 64. An O-ring 65 is interposed between the injector base 61 and the base housing portion 64 to secure the air-tightness inside the processing container 12.

Figure 3:
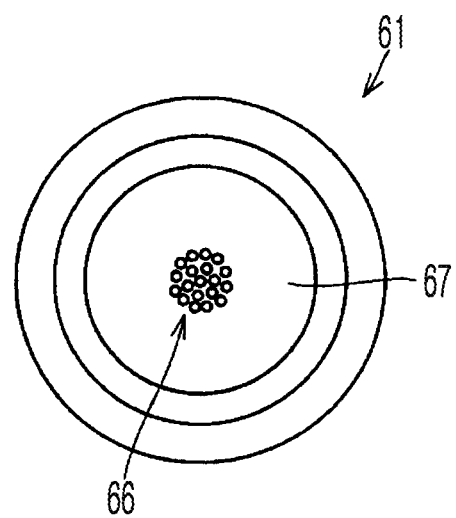
FIG. 3 is a diagram showing an injector base included in the plasma processing apparatus shown in FIG. 1, the injector base viewed in a direction corresponding to the arrow III in FIG. 1.

The injector base 61 is formed of alumited aluminum, $Y_2O_3$ (yttria)-coated aluminum, or the like. Here, the portion of the injector base 61 located inner than the O-ring 65 may be preferably formed of $Y_2O_3$ (yttria)-coated aluminum, whereas the portion of the injector base 61 located outer than the O-ring 65 may be preferably formed of alumited aluminum. The injector base 61 viewed in a direction corresponding to the arrow III in FIG. 1 is shown in FIG. 3. Furthermore, although not shown, such an injector base 61 formed of a conductor is grounded outside the plasma processing apparatus 11.

A supply hole 66, which supplies a reactive gas for a plasma processing into the processing container 12, is formed in the injector base 61. In the injector base 61, the supply hole 66 is formed in a wall surface 67 facing the holding stage 14. The wall surface 67 facing the holding stage 14 is flat. A plurality of the supply holes 66 are formed in the wall surface 67. The supply hole 66 is formed in the injector base 61 to be located at the center in the diametric direction of the dielectric plate 16, and a portion of the wall surface 67 including the supply hole 66 is exposed to inside of the processing container 12.

A gas passage 68 is provided in the reactive gas supply unit 13 so as to penetrate the center conductor 25 of the coaxial waveguide 24, the slot antenna 30, and the dielectric plate 16, and reach the supplying hole 66. A gas supply system 72 is connected to a gas inlet 69 provided on the top end of the center conductor 25 via an opening and shutting valve 70 or a flow controller 71, such as a mass flow controller. A reactive gas is supplied as a flow or the like of the reactive gas is controlled by the gas control system 72.

Next, a method of performing a plasma processing on the substrate to be processed W by using the plasma processing apparatus 11 according to an embodiment of the present invention will be described.

First, the substrate to be processed W is held by the holding stage 14. Next, the interior of the processing container 12 is depressurized to a predetermined pressure, and the interior of the processing container 12 is maintained to a predetermined pressure by supplying a reactive gas from the reactive gas supply unit 13. In detail, a reactive gas is transported from the gas passage 68 and is supplied from the supply hole 66 into the processing container 12 toward the central region of the substrate to be processed W. Next, a microwave for exciting plasma is generated by the microwave generator 15, and plasma is generated in the processing container 12 by transmitting the microwave into the processing container 12 via the dielectric plate 16. The reactive gas includes a reactive gas containing oxygen. Accordingly, a plasma processing is performed on the substrate to be processed W.

Here, during the generation of plasma, an electric field due to a microwave plasma is generated in up and down direction between the holding stage 14 and the dielectric plate 16. If a member formed of a conductor is arranged in such a region and is exposed to the electric field, the electric field may concentrate on the member and a load due to the electric field may be applied to the member.

However, in the plasma processing apparatus 11 as described above, since the injector base 61 included in the reactive gas supply unit 13 is arranged at a location more recessed inside the dielectric plate 16 than the bottom surface 63 of the dielectric plate 16, the injector base 61 is not exposed to a region where an electric field is generated, during a plasma processing. In this case, a possibility that an electric field concentrate on the injector base 61, in which the supplying hole 66 for supplying a reactive gas into the processing container 12 is formed, may be reduced, and thus a load with respect to the injector base 61 due to an electric field may be reduced. Therefore, the plasma processing apparatus 11 as described above may have a long lifespan.

Furthermore, although an experiment using the mixed gas containing Ar as a reactive gas has been performed in the plasma processing apparatus 11, the temperature of the injector base 61 did not rise.

Although the wall surface 67 of the injector base 61 facing the holding stage 14 is flat in the embodiment described above, the shape of the wall surface 67 is not limited thereto, and the wall surface 67 may have another shape or irregularity.

Figure 4:
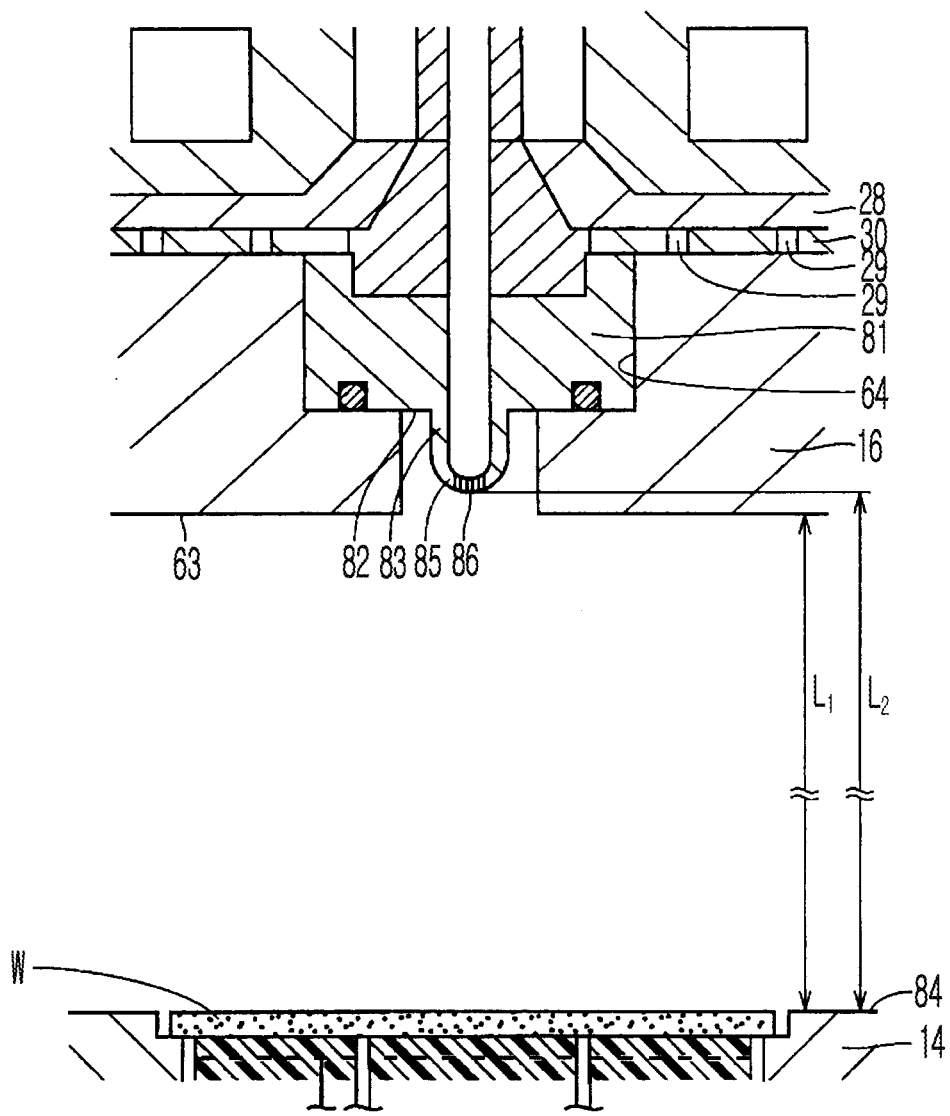
FIG. 4 is a magnified cross sectional view showing a portion of a plasma processing apparatus according to another embodiment of the present invention, the portion corresponding to the portion shown in FIG. 2.

Furthermore, a protrusion may be formed to extend from the wall surface 67 facing the holding stage 14 toward the holding stage 14 and a supply hole may be formed in the front end portion of the protrusion. FIG. 4 is a magnified cross sectional is view of a portion of such a plasma processing apparatus, the portion corresponding to the portion shown in FIG. 2. Furthermore, the structure shown in FIG. 4 is identical to the structure shown in FIG. 2 except configurations of injector bases. Therefore, the members shown in FIG. 4 that are identical to corresponding members shown in FIG. 2 will be denoted by same reference numerals as the corresponding members shown in FIG. 2, and detailed description thereof will be omitted.

As shown in FIG. 4, an injector base 81 includes a protrusion 83, which extends from a wall surface 82 facing the holding stage 14 toward the holding stage 14 and has a length which does not reach the bottom surface 63 of the dielectric plate 16. In detail, in FIG. 4, a distance $L_2$ between the top surface 84 of the holding stage 14 and the front end portion 85 of the protrusion 83 is greater than a distance $L_1$ between the top surface 84 of the holding stage 14 and the bottom surface 63 of the dielectric plate 16. Furthermore, a supply hole 86 is formed in the front end portion 85 of the protrusion 83.

From the configuration stated above, an electric field does not concentrate on the front end portion 85 of the protrusion 83 of the injector base 81, and thus a load with respect to the injector base 81 due to an electric field may be reduced. In this case, since a reactive gas may be supplied from the supply hole 86 at a location relatively close to the substrate to be processed W, the efficiency of a plasma processing may be improved.

Here, the length of the protrusion 83 from the wall surface 82 facing the holding stage 14 to the front end portion 85 may be preferably different from the resonance length of an electric field generated between the holding stage 14 and the dielectric plate 16 when a microwave is transmitted into the processing container 12. Therefore, an effect to the protrusion 83 due to resonance between the protrusion 83 and an electric field may be reduced and thus load with respect to the protrusion 83 may be reduced.

Furthermore, according to another embodiment of the present invention, the configuration as described below may be employed.

Figure 5:
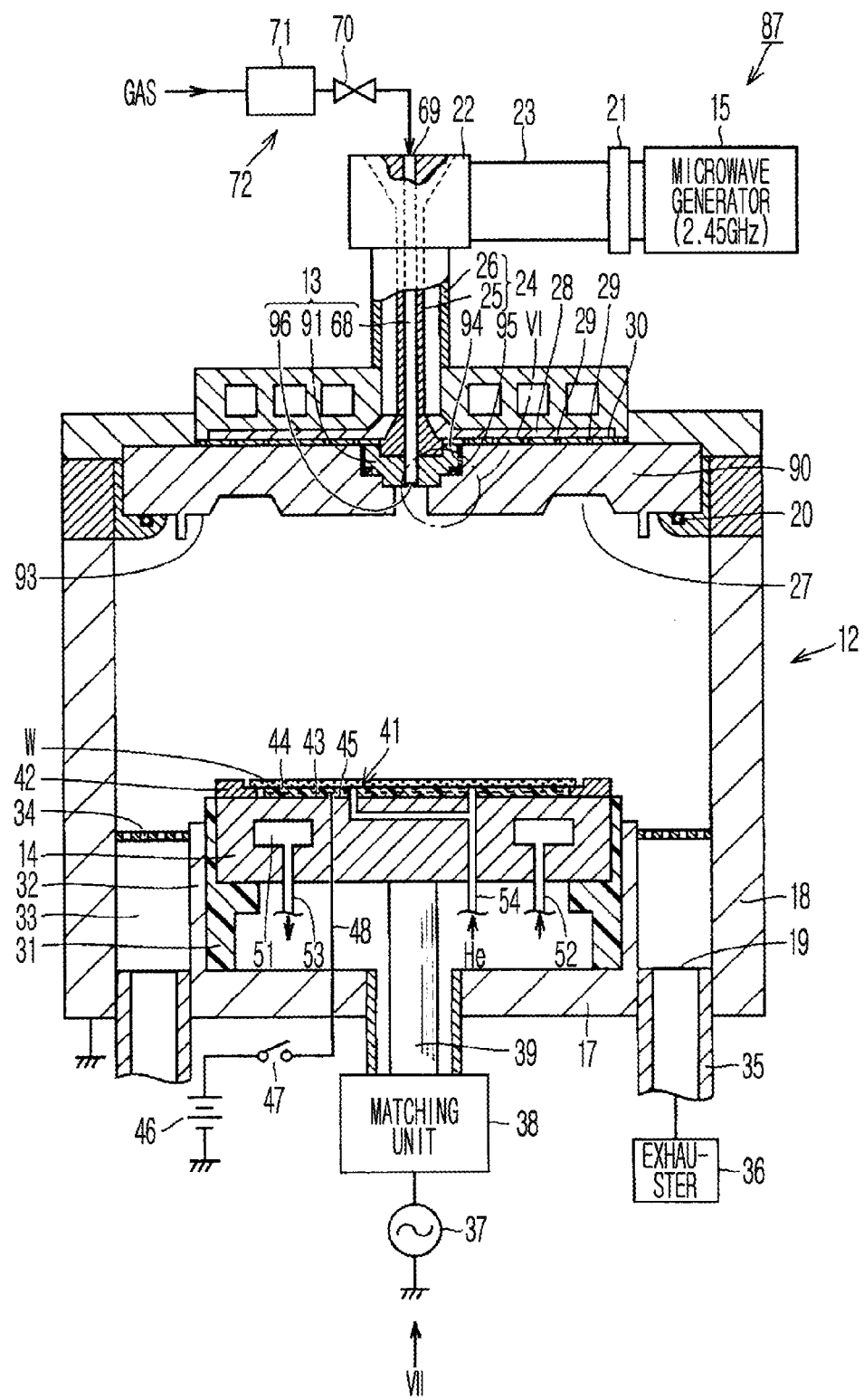
FIG. 5 is a schematic cross sectional view showing the major portion of a plasma processing apparatus according to another embodiment of the present invention.
Figure 6:
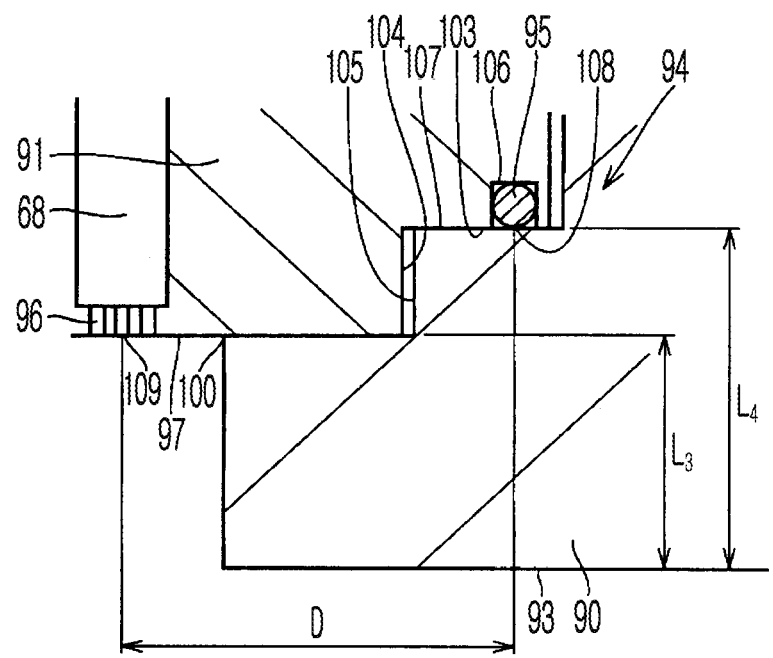
FIG. 6 is a magnified view of a portion indicated by VI in the plasma processing apparatus shown in FIG. 5.

FIG. 5 is a schematic cross sectional view showing the major portion of a plasma processing apparatus 87 according to another embodiment of the present invention. FIG. 6 is a diagram showing a portion indicated by VI in the plasma processing apparatus shown in FIG. 5. Furthermore, the configuration shown in FIG. 5 is identical to the configuration shown in FIG. 1 except configurations of injector bases and dielectric is plates. Therefore, the members shown in FIG. 5 that are identical to corresponding members shown in FIG. 1 will be denoted by same reference numerals as the corresponding members shown in FIG. 1, and detailed description thereof will be omitted.

Figure 7:
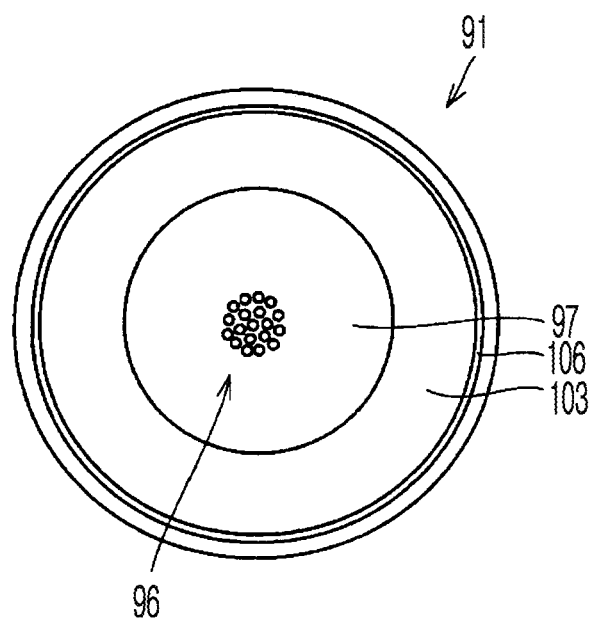
FIG. 7 is a diagram showing an injector base included in the plasma processing apparatus shown in FIG. 5, the injector base viewed in a direction corresponding to the arrow VII in FIG. 5.

Referring to FIG. 5, a supply hole 96 is formed in a wall surface 97, which is a surface facing the holding stage 14 and is partially exposed to the inside of the processing container 12. In other words, a portion of the wall surface 97 of an injector base 91 is not covered by a dielectric plate 90 in which a base housing portion 94 is formed, and is exposed to the inside of the processing container 12. The portion of the wall surface 97 exposed to the inside of the processing container 12 is a portion inner than an innermost point 100 covered by the dielectric plate 90 in FIG. 6. The supply hole 96 is formed in the portion of the wall surface 97 exposed to the inside of the processing container 12. The wall surface 97 is flat. The injector base 91 viewed in a direction corresponding to the arrow VII in FIG. 5 is shown in FIG. 7. A plurality of the supply holes 96 are formed in the wall surface 97. The supply holes 96 are formed to be located at the center in the diametric direction of the injector base 91.

In the injector base 91, a ring-shaped O-ring 95 is disposed on a wall surface 103 facing a wall surface 107 of the base housing portion 94 to serve as a seal, which is closely adhered to the wall surface 107 of the base housing portion 94 and seals the interior of the processing container 12. The O-ring 95 is formed of a perfluoro-based rubber member. Furthermore, the portion of the injector base 91 located inner than the O-ring 95 may be preferably formed of $Y_2O_3$ (yttria)-coated aluminum, whereas the portion of the injector base 91 located outer than the O-ring 95 may be preferably formed of alumited aluminum.

The O-ring 95 is disposed to be interposed between the wall surface 103 of the injector base 91 and the wall surface 107 of the base housing portion 94. In detail, a ring-shaped recess portion 106, which is recessed from the wall surface 103 to house the O-ring 95, is formed in the wall surface 103, and the O-ring 95 is disposed to be housed in the recess portion 106. The location of the O-ring 95 may be stabilized. Furthermore, the wall surface 103 is disposed at a periphery of the wall surface 107, and the wall surface 97 and the wall surface 103 are substantially parallel to each other.

Here, a step is formed between the wall surface 97 exposed to the inside of the is processing container 12 and the wall surface 103, on which the O-ring 95 is provided. The step is formed of the wall surface 97 and a wall surface 104 which extends in a direction perpendicular to both the wall surface 97 and the wall surface 103. Furthermore, a distance $L_3$ between the bottom surface 93 of the dielectric plate 90 and the wall surface 97 exposed to the inside of the processing container 12 is smaller than a distance $L_4$ between the bottom surface 93 of the dielectric plate 90 and the wall surface 103, on which the O-ring 95 is provided. A wall surface 105, which faces the wall surface 104 and is substantially parallel to the wall surface 104, is formed in the base housing portion 94.

Next, a method of performing a plasma processing on the substrate to be processed W by using the plasma processing device 87 according to another embodiment of the present invention will be described.

First, the substrate to be processed W is held by the holding stage 14. Next, the interior of the processing container 12 is depressurized to a predetermined pressure, and the interior of the processing container 12 is maintained to a predetermined pressure by supplying a reactive gas 13 from the reactive gas supply unit 13. In detail, a reactive gas is transported from the gas passage 68 and is supplied from the supply hole 96 into the processing container 12 toward the central region of the substrate to be processed W. Next, a microwave for exciting plasma is generated by the microwave generator 15, and plasma is generated in the processing container 12 by transmitting the microwave into the processing container 12 via the dielectric plate 90. The reactive gas includes a reactive gas containing oxygen. Accordingly, a plasma processing is performed on the substrate to be processed W.

Here, during the plasma processing, a radical of the reactive gas is generated in the sealed space inside the processing container 12. In this case, an oxygen radical is generated.

However, in the plasma processing apparatus 87 as described above, a step is formed between the wall surface 97 on which the supply hole 96 is formed and which is exposed to the inside of the processing container 12 and the wall surface 103, on which the O-ring 95 is provided. In detail, the wall surface 104, which extends in a direction perpendicular to the wall surface 97 and the wall surface 103 and forms the step between the wall surface 97 and the wall surface 103, is formed. Therefore, a sufficient is distance may be secured between the wall surface 97 exposed to the inside of the processing container 12 and the wall surface 103, on which the O-ring 95 is provided. In this case, since the O-ring 95 may be arranged in a region with a relatively low radical concentration, aggressiveness of a radical with respect to the O-ring 95 may be reduced. Therefore, reduction of the lifespan of the O-ring 95 may be prevented, and thus the plasma processing apparatus 87 may have a long lifespan.

Here, relationships between the amount of an oxygen radical and the location of an O-ring in a plasma processing apparatus in which no step is formed between a wall surface exposed to the inside of a processing container and a wall surface on which the O-ring is provided, and a plasma processing apparatus according to the present invention will be described.

Figure 8:
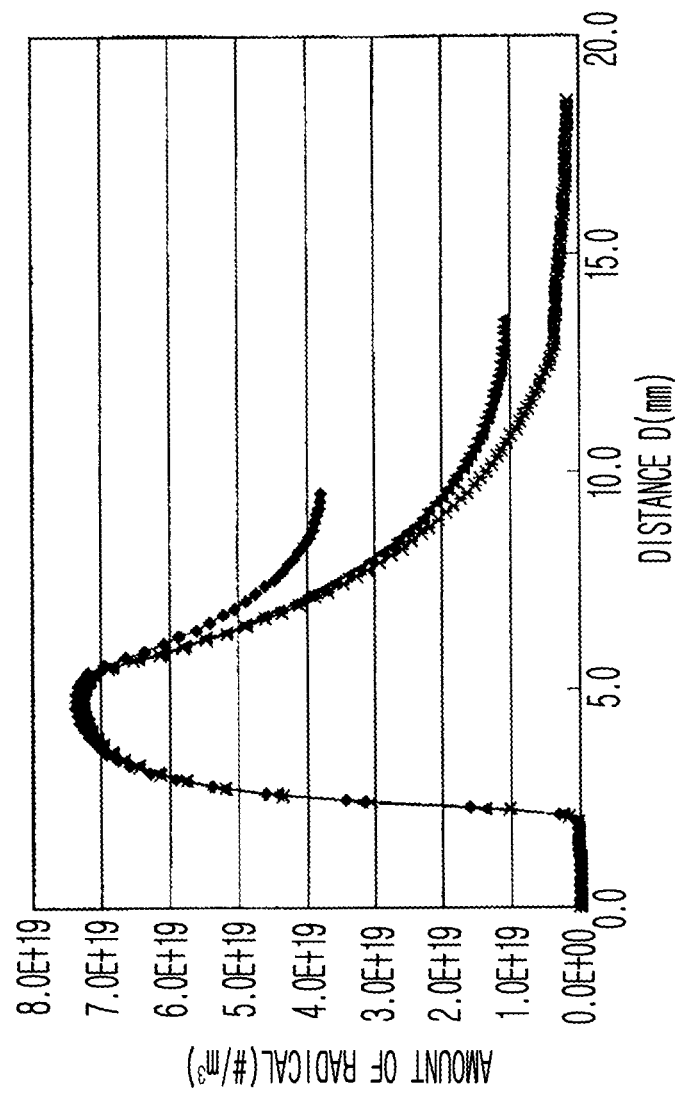
FIG. 8 is a graph showing relationships between the amount of an oxygen radical and the location of an O-ring in a plasma processing apparatus in which no step is formed and a plasma processing apparatus according to the present invention.

FIG. 8 is a graph showing relationships between the amount of oxygen radical and the location of an O-ring in a plasma processing apparatus in which no step is formed, and a plasma processing apparatus according to the present invention. In FIG. 8, the vertical axis indicates the amounts of oxygen radical ($\#/m^3$), whereas the horizontal axis indicates locations (mm) of an O-ring using a distance D between the center portion 109 in the diametric direction of the wall surface 97 and a contact portion 108, at which the O-ring 95 and the wall surface 107 contact each other.

Figure 9:
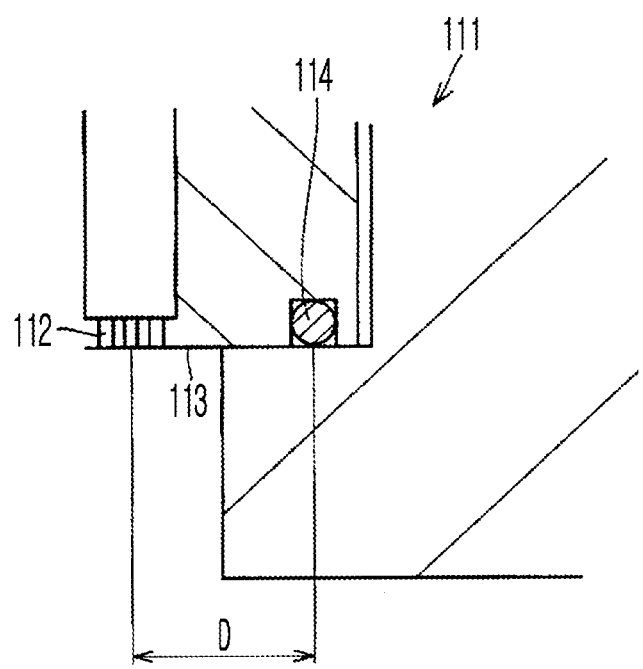
FIG. 9 is a schematic cross sectional view showing a portion of the plasma processing apparatus in which no step is formed, the portion corresponding to the portion shown in FIG. 6.
Figure 10:
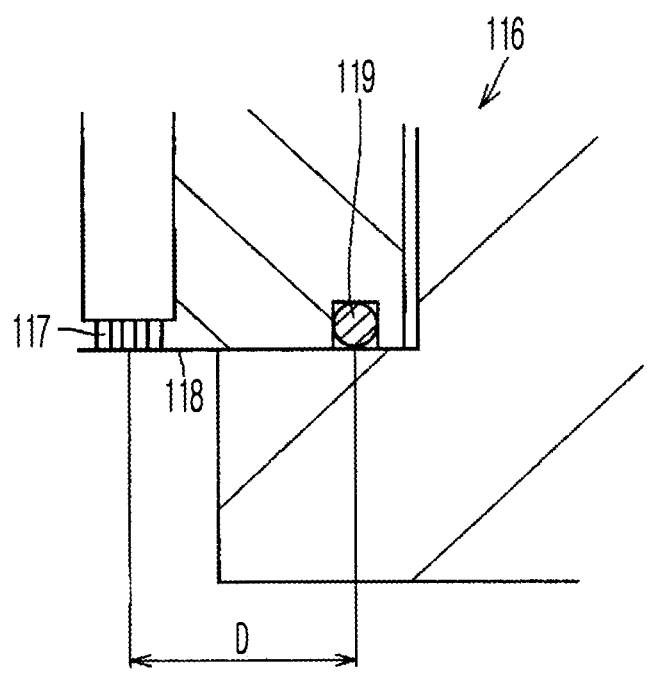
FIG. 10 is a diagram showing a portion of a plasma processing apparatus in which a distance to a location, at which an O-ring is provided, is greater than the corresponding distance in the plasma processing apparatus shown in FIG. 9, the portion corresponding to the portion shown in FIG. 6.

FIG. 9 is a schematic cross sectional view showing a portion of a plasma processing apparatus 111 in which no step is formed, the portion corresponding to the portion shown in FIG. 7. In FIG. 9, a wall surface 113, in which a supply hole 112 is formed and exposed to the inside of a processing container, is flush with a wall surface 113, on which an O-ring 114 is provided. In other words, no step is formed between the wall surface 113, which is exposed to the inside of the processing container, and the wall surface 113, on which the O-ring 114 is provided. FIG. 10 shows a portion of a plasma processing apparatus 116 in which a distance to a location at which an O-ring 119 is provided is greater than the corresponding distance in the plasma processing apparatus 111 shown in FIG. 9, the portion corresponding to the portions shown in FIGS. 6 and 9. In FIG. 10, a wall surface 118 in which a supply hole 117 is formed and exposed to the inside of the processing container is flush with a wall surface 118 on which an O-ring 119 is provided. In FIG. 8, the square marks indicate the case corresponding to the plasma processing apparatus 111 shown in FIG. 9, the triangle marks indicate the case is corresponding to the plasma processing apparatus 116 shown in FIG. 10, and the X marks indicates the case corresponding to the plasma processing apparatus 87 according to the present invention shown in FIGS. 5 and 6.

As shown in FIGS. 5 through 10, in case of the plasma processing apparatus 111 shown in FIG. 9, at a location at which D is approximately 10 mm, the amount of radical is 3.8E+19. In case of the plasma processing apparatus 116 shown in FIG. 10, at a location at which D is approximately 14 mm, the amount of radical is 1.09E+19. On the contrary, in case of the plasma processing apparatus 87 shown in FIGS. 5 and 6, at a location at which D is approximately 19 mm, the amount of radical is 1.77E+18. Accordingly, in the plasma processing apparatus in which a step is formed, an O-ring may be disposed at a location with a small amount of radical.

Figure 11:
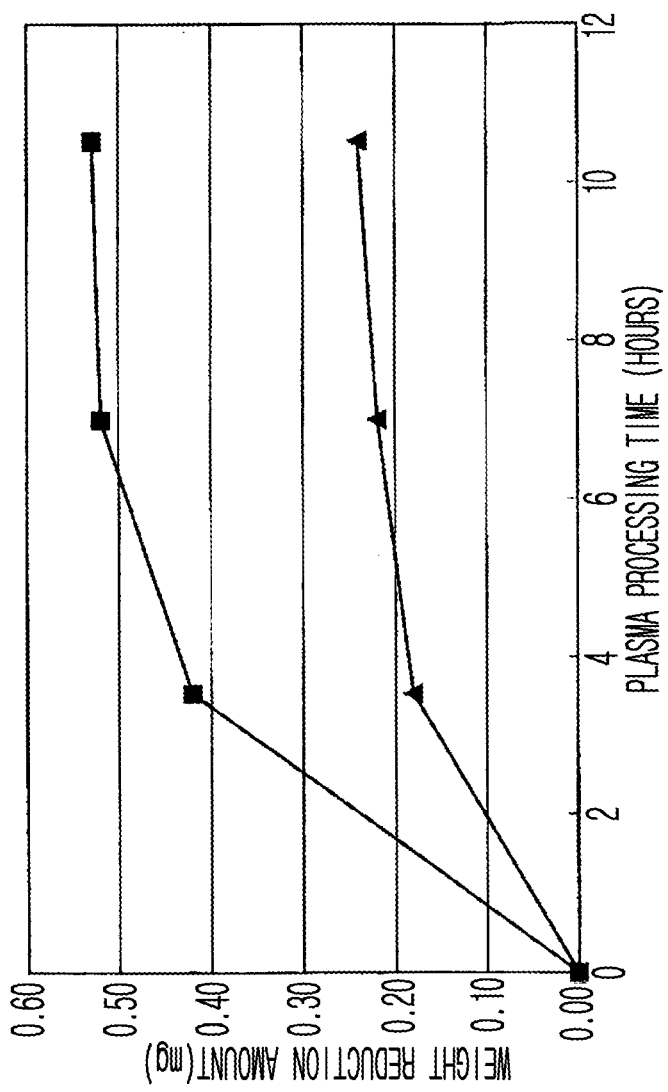
FIG. 11 is a graph showing a relationship between weight reduction amount of an O-ring and a plasma processing time.
Figure 12:
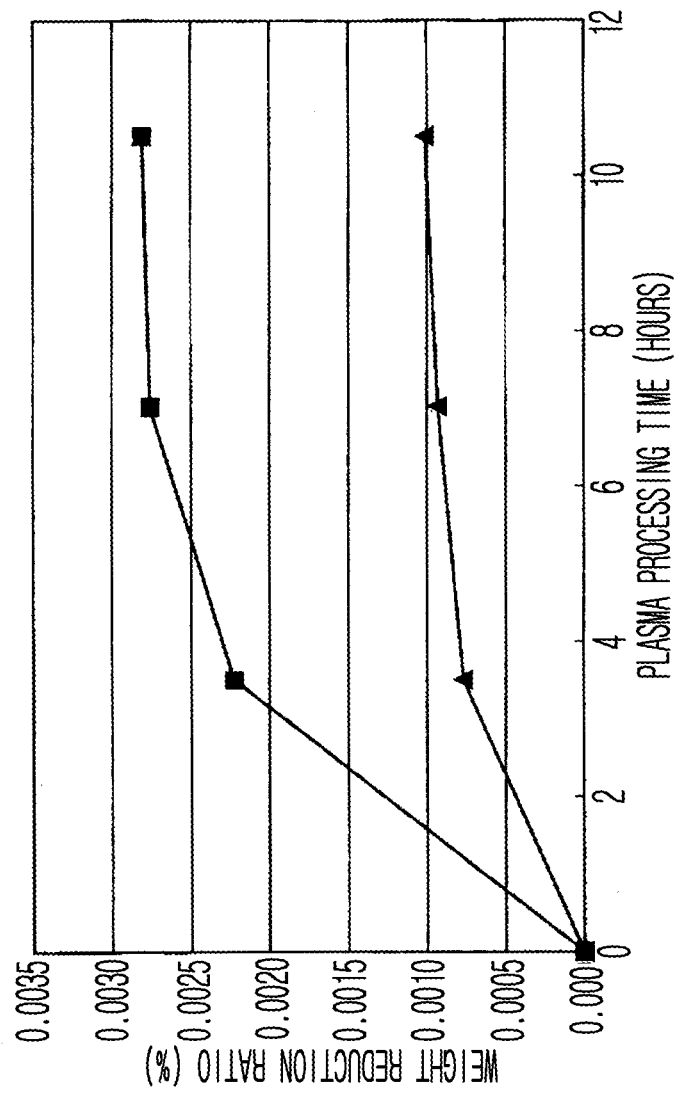
FIG. 12 is a graph showing a relationship between weight reduction ratio of an O-ring and a plasma processing time.

Next, an effect with respect to an O-ring will be described. FIG. 11 is a graph showing a relationship between a weight reduction amount of an O-ring and a plasma processing time. FIG. 12 is a graph showing a relationship between a weight reduction ratio of an O-ring and a plasma processing time. The vertical axis indicates the weight reduction amounts (mg) of an O-ring in FIG. 11, whereas the vertical axis indicates the weight reduction ratios (%) of an O-ring in FIG. 12. In FIGS. 11 and 12, the horizontal axis indicates plasma processing times (hours). Furthermore, in FIGS. 11 and 12, square marks indicate the case corresponding to the plasma processing apparatus shown in FIG. 9, whereas triangle marks indicate the case corresponding to the plasma processing apparatus according to the present invention shown in FIG. 6. In the plasma processing device indicated by the square marks, a distance from the center in the diametric direction to a location at which an O-ring is provided is fixed. Furthermore, in FIGS. 11 and 12, the more the weight of the O-ring is reduced, the more the O-ring is worn off.

As shown in FIGS. 11 and 12, in case of the plasma processing device indicated by the square marks, an O-ring shows a significant weight reduction after 4 hours has passed, as compared to the plasma processing device indicated by the triangle marks. After 10 hours has passed, the weight reduction ratio of the O-ring is about 0.030% in case of the plasma processing device indicated by the square marks, whereas the weight reduction ratio of the O-ring is about 0.010% in case of the plasma processing device indicated by the triangle marks, that is, loss of the O-ring in case of the plasma is processing device indicated by the triangle marks is only one-third of loss of the O-ring in case of the plasma processing device indicated by the square marks.

As described above, in a plasma processing apparatus according to the present invention, reduction of the lifespan of an O-ring may be prevented, and thus the plasma processing apparatus may have a long lifespan.

Furthermore, although the distance $L_3$ between the bottom surface 93 of the dielectric plate 90 and the wall surface 97 exposed to the inside of the processing container 12 is smaller than the distance $L_4$ between the bottom surface 93 of the dielectric plate 90 and the wall surface 103, on which the O-ring 95 is provided, in the embodiment described above, the present invention is not limited thereto. The distance $L_3$ between the bottom surface 93 of the dielectric plate 90 and the wall surface 97 exposed to the inside of the processing container 12 may be greater than the distance $L_4$ between the bottom surface 93 of the dielectric plate 90 and the wall surface 103, on which the O-ring 95 is provided.

Figure 13:
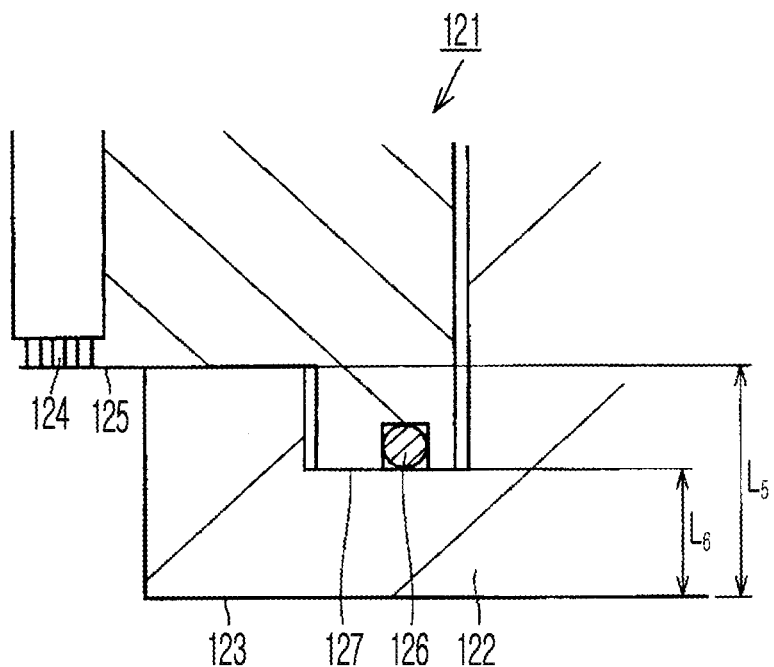
FIG. 13 is a magnified cross sectional view of a portion of a plasma processing apparatus according to another embodiment of the present invention.

FIG. 13 is a magnified cross sectional view of a portion of a plasma processing apparatus 121 according to the above mentioned embodiment, the portion corresponding to the portion shown in FIG. 6. As shown in FIG. 13, in the plasma processing apparatus 121 according to another embodiment of the present invention, a distance $L_5$ between a bottom surface 123 of a dielectric plate 122 and a wall surface 125 having a supply hole and exposed to the inside of a processing container is longer than a distance $L_6$ between the bottom surface 123 of the dielectric plate 122 and a wall surface 127 in which an O-ring 126 is provided. Even in the configuration stated above, the distance stated above may be sufficiently long and reduction of the lifespan of the O-ring 126 may be prevented, whereby the plasma processing apparatus 121 may have a long lifespan.

Figure 14:
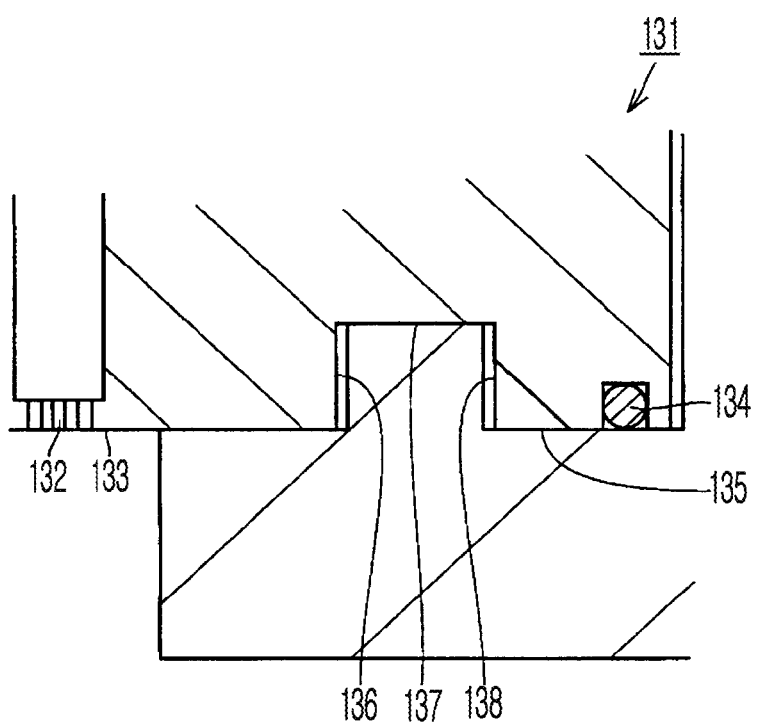
FIG. 14 is a magnified cross sectional view of a portion of a plasma processing apparatus according to another embodiment of the present invention.

Furthermore, even if a distance between the bottom surface of a dielectric plate and a wall surface exposed to the inside of a processing container is same as a distance between the bottom surface of the dielectric plate and a wall surface, on which an O-ring is disposed, as in a plasma processing apparatus 131 according to another embodiment of the present invention shown in FIG. 14, a plurality of wall surfaces 136, 137, and 138 may be formed between a wall surface 133 having a supply hole 132 and exposed to the inside of a processing container and a wall surface 135, on which an O-ring 134 is disposed, so that a step is formed between the wall surface 133 and the wall surface 135.

Furthermore, although a wall surface forming a step is a wall surface extending in a direction perpendicular to both a wall surface exposed to the inside of a processing container and a wall surface, on which a seal is provided, in the embodiments described above, the present invention is not limited thereto. The wall surface forming a step may be a wall surface extending in a direction perpendicular to either the wall surface exposed to the inside of the processing container or the wall surface, on which the seal is provided, or may be a wall surface extending in a direction, which is not perpendicular to any of both wall surfaces and is slant with respect to the wall surfaces. Furthermore, the wall surface forming a step may include an arc shape cross section in the cross section view shown in FIG. 2 and the like. Furthermore, a plurality of steps may be formed by a plurality of wall surfaces.

Furthermore, although a wall surface of an injector base facing a holding stage, the wall surface exposed to the inside of a processing container, is flat in the embodiments described above, the shape of the wall surface is not limited thereto, and the wall surface may have another shape or unevenness.

Figure 15:
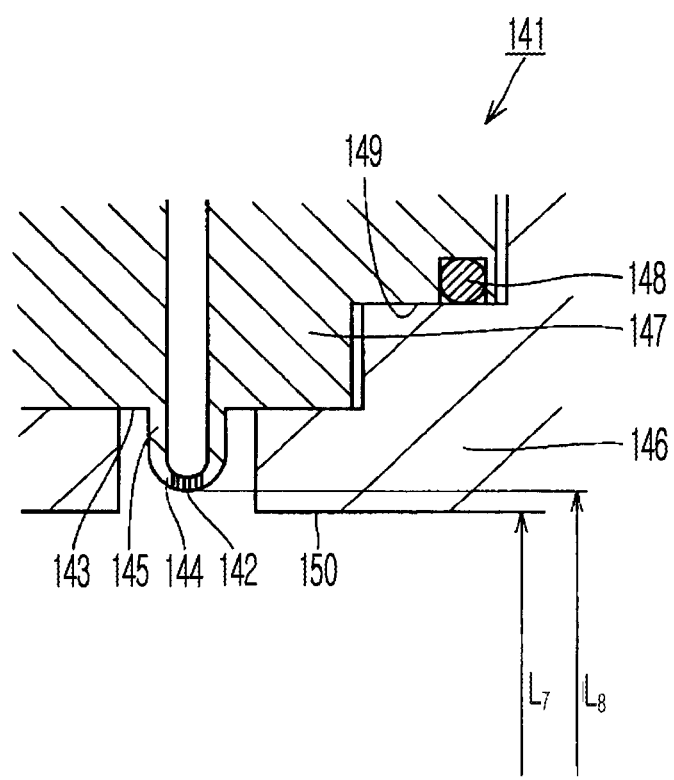
FIG. 15 is a magnified cross sectional view of a portion of a plasma processing apparatus according to another embodiment of the present invention.
Figure 16:
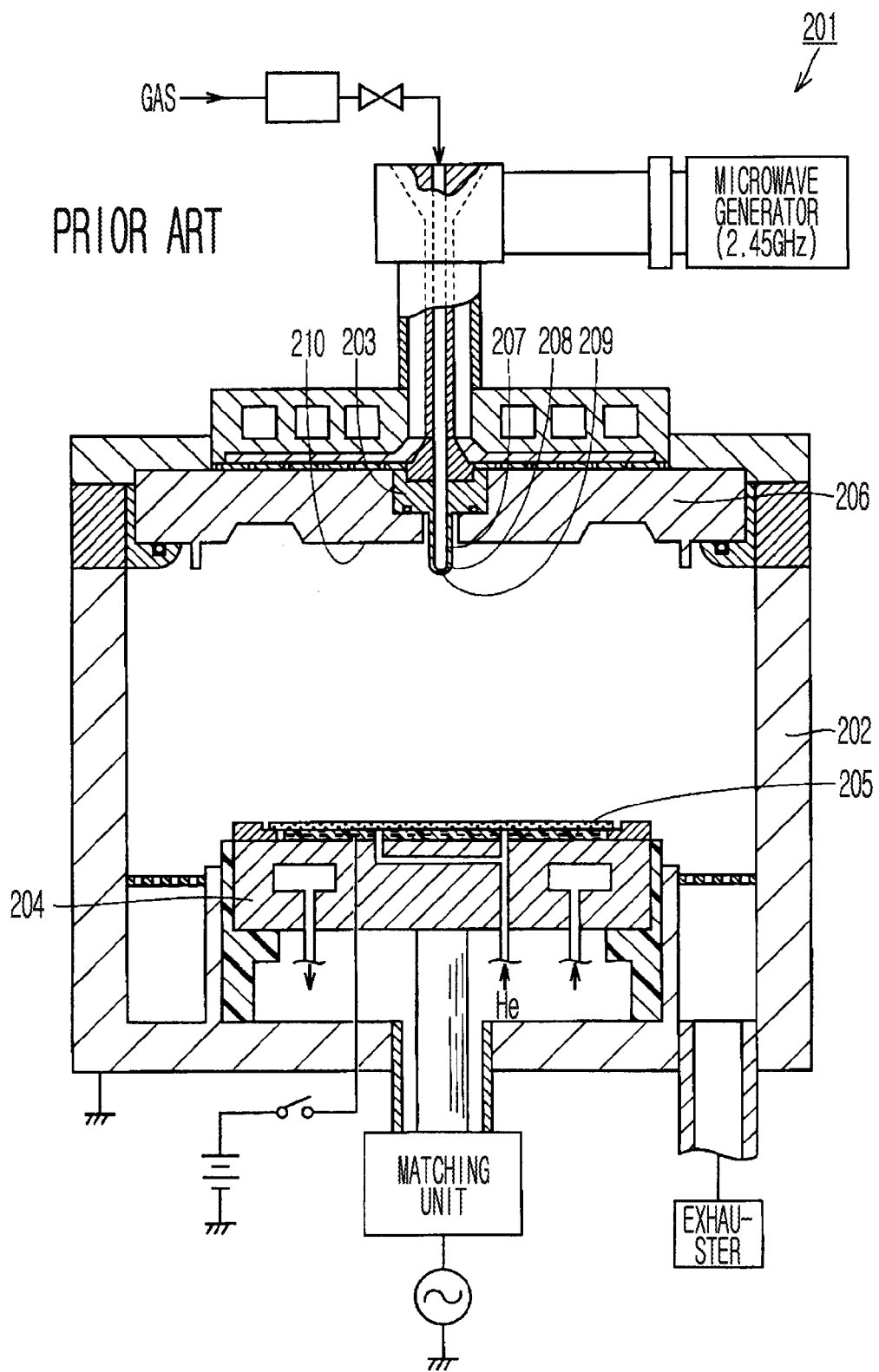
FIG. 16 is a schematic cross sectional view showing the major portion of a plasma processing apparatus employing a center gas introduction mechanism, which includes an injector.

Furthermore, a wall surface exposed to the inside of a processing container may include a protrusion, which protrudes toward a holding stage, and a supply hole may be formed in the front end portion of the protrusion. FIG. 15 is a cross sectional view showing a portion of a plasma processing apparatus 141 according to embodiment corresponding to the this case, the portion corresponding to the portion shown in FIG. 6. As shown in FIG. 15, in an injector base 147 included in the plasma processing apparatus 141, a wall surface 143 which faces a holding stage (not shown) located at lower side of FIG. 15, includes a protrusion 145, which protrudes toward the holding stage. A supply hole 142 is formed in the front end portion 144 of the protrusion 145. A step is formed between the wall surface 143 exposed to the inside of a processing container and a wall surface 149, on which an O-ring 148 is provided. The effect as described above may also be obtained by employing this configuration. Here, the wall surface 143 exposed to the inside of the processing container refers to a wall surface including a portion which will not be covered by a dielectric plate 146 having a base housing portion. In the embodiment shown in FIG. 15, the wall surface 143 exposed to is the inside of the processing container refers to the wall surface 143 extending in left and right direction of FIG. 15.

Furthermore, in this case, as to a length of the protrusion 145 protruding from the wall surface 143, the front end portion 144 of the protrusion 145 may be located inside the dielectric plate 146, which is a location inner than the bottom surface 150 of the dielectric plate 146. In detail, a distance $L_7$ from the top surface of a holding stage to the bottom surface 150 of the dielectric plate 146 is smaller than a distance $L_8$ between the top surface of the holding stage and the front end portion 144 of the protrusion 145. During a plasma processing, an electric field is generated to the bottom surface 150 of the dielectric plate 146. However, by employing the configuration as described above, a possibility that an electric field concentrates on the front end portion 144 of the protrusion 145 may be reduced, and thus a load with respect to the protrusion 145 due to an electric field may be reduced.

Furthermore, although an O-ring is provided as a seal in the embodiments described above, the present invention is not limited thereto, and any other seal may be provided for sealing a space between an injector base and a base housing portion. Furthermore, a non-sealing ring, which is formed of PTFE (Poly Tetra Fluoro Ethylene) or the like, may be arranged inside an O-ring, that is, in a space between the O-ring and a wall surface exposed to the inside of a processing container, so that a radical generated thereby may be captured. Accordingly, damages to an O-ring due to a radical may further be reduced, and thus a plasma processing apparatus may have a long lifespan.

Furthermore, although a mixed gas containing oxygen is used as a reactive gas in the embodiments described above, the present invention is limited thereto, and may be applied to cases of using mixed gases containing other gas that generates radicals during plasma processing. In detail, although halogen radicals are generated by halogen-based gases, such as fluorine gas, chlorine gas, bromide gas, or iodine gas, the present invention may also be applied to cases of using such halogen-based gases.

Furthermore, although an injector base is formed of a conductor in the embodiments described above, the present invention is not limited thereto, and an injector base may also be formed of an insulator, such as quartz.

While the present invention has been particularly shown and described with is reference to exemplary embodiments thereof, it will be understood by those of ordinary skill in the art that various changes in form and details may be made therein without departing from the spirit and scope of the present invention as defined by the following claims.

INDUSTRIAL APPLICABILITY

A plasma processing apparatus according to the present invention is effective in the case where a long lifespan is demanded.

The invention claimed is:

1. A plasma processing apparatus comprising:
   a processing container in which a plasma processing is performed on a substrate to be processed;
   a holding stage which is disposed in the processing container and holds thereon the substrate to be processed;
   a microwave generator which generates a microwave for exciting plasma;
   a dielectric plate which is provided at a location facing the holding stage and transmits a microwave into the processing container, the dielectric plate having a bottom surface facing the holding stage;
   a base housing portion, which penetrates an upper portion of the dielectric plate in a plate vertical thickness direction; and
   a reactive gas supply unit which supplies a reactive gas for plasma processing toward a central region of the substrate to be processed held by the holding stage,
   wherein the reactive gas supply unit includes an injector base, which is housed inside the base housing portion, and has a wall surface exposed to the inside of the processing container and directly open toward the holding stage and a supply hole formed in the wall surface, a reactive gas being supplied into the processing container through the supply hole, the wall surface and the supply hole being positioned vertically above the bottom surface of the dielectric plate, and
   a seal provided between an inner wall of the base housing portion and the wall surface of the injector base.

2. The plasma processing apparatus of claim 1, wherein a distance between the bottom surface of the dielectric plate and the wall surface, of the injector base, exposed to the inside of the processing container is different from a distance between the bottom surface of the dielectric plate and the wall surface, of the injector base, on which the seal is provided.

3. The plasma processing apparatus of claim 2, wherein a distance between the bottom surface of the dielectric plate and the wall surface, of the injector base, exposed to the inside of the processing container is greater than a distance between the bottom surface of the dielectric plate and the wall surface, of the injector base, on which the seal is provided.

4. The plasma processing apparatus of claim 1, wherein the injector base includes a protrusion, which extends from the wall surface of the injector base facing the holding stage toward the holding stage and whose length is within a range of not reaching the wall surface of the dielectric plate facing the holding stage.

5. The plasma processing apparatus of claim 4, wherein the supply hole is formed in the front end portion of the protrusion.

6. The plasma processing apparatus of claim 1,
   further comprising a step, which is formed between the wall surface, of the injector base, exposed to the inside of the processing container and the wall surface, of the injector base, on which the seal is provided,
   the wall surface, on which the seal is provided, is disposed at a periphery of the step.

7. The plasma processing apparatus of claim 6,
   wherein
   a wall surface of the injector base forming the step includes a surface extending perpendicularly to at least one of the wall surface, of the injector base, exposed to the inside of the processing container and the wall surface, of the injector base, on which the seal is provided.

8. The plasma processing apparatus of claim 6,
   wherein
   a recess portion, which is recessed from the wall surface of the injector base so as to house the seal, is formed in the wall surface of the injector base, on which the seal is provided.

9. The plasma processing apparatus of claim 6,
   wherein
   a plurality of the steps are formed.

10. The plasma processing apparatus of claim 1,
    wherein
    the seal includes an O-ring.

11. The plasma processing apparatus of claim 1,
    wherein
    the reactive gas includes a mixed gas containing oxygen.

12. The plasma processing apparatus of claim 1,
    wherein the injector base is formed of aluminated aluminum or $Y_2O_3$(yttria)-coated aluminum.

* * * * *